(12) United States Patent  
Iwabuchi et al.

(10) Patent No.: US 6,225,628 B1  
(45) Date of Patent: *May 1, 2001

(54) SCANNING ELECTRON MICROSCOPE

(75) Inventors: Yuko Iwabuchi, Mito; Mitsugu Sato, Hitachinaka, both of (JP)

(73) Assignee: Hitachi, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/987,308

(22) Filed: Dec. 9, 1997

(30) Foreign Application Priority Data

Dec. 10, 1996 (JP) ................................... 8-329638

(51) Int. Cl.[7] .......................... H01J 37/28; G01N 23/225
(52) U.S. Cl. ........................ 250/310; 250/491.1
(58) Field of Search .................. 250/307, 310, 250/491.1

(56) References Cited

U.S. PATENT DOCUMENTS

| 4,184,206 | * | 1/1980 | Harano | 364/515 |
| 4,673,988 | * | 6/1987 | Jansson et al. | 358/280 |
| 5,216,500 | * | 6/1993 | Krummey et al. | 258/93 |
| 5,444,245 | * | 8/1995 | Kitamura | 250/307 |
| 5,497,007 | * | 3/1996 | Uritsky et al. | 250/491.1 |
| 5,512,747 | * | 4/1996 | Maeda | 250/310 |
| 5,659,172 | * | 8/1997 | Wagner et al. | 250/307 |
| 5,834,774 | * | 11/1998 | Negishi et al. | 250/310 |

FOREIGN PATENT DOCUMENTS 54-78075A   6/1979   (JP) .

* cited by examiner

Primary Examiner—Bruce C. Anderson  
(74) Attorney, Agent, or Firm—Kenyon & Kenyon

(57) ABSTRACT

A secondary electron signal obtained from a specimen when the specimen is scanned with an electron beam is detected by a detector and a specimen image is displayed on a first display screen area of an image display unit on the basis of the detected signal. The specimen image is stored, as an image for observation position designation, in a storage unit together with a position of the image. A plurality of images at different positions on the specimen may be used as the image to be stored. One of the stored images is selected and read and displayed on a second display screen area. When a part of interest on the displayed image for observation position designation is selected, the specimen is horizontally moved so that a position of the part of interest may be positioned at the center of the first display screen area and an enlarged image of the part of interest may be displayed on the first display screen area. This facilitates view field search outside a view field range.

7 Claims, 3 Drawing Sheets

SCANNING ELECTRON MICROSCOPE

BACKGROUND OF THE INVENTION

The present invention relates to a scanning electron microscope for obtaining an image of a specimen by detecting an information signal which is generated by scanning the specimen with an electron beam and which is characteristic of the specimen.

In a scanning electron microscope, with the aim of moving a position designated on an image to a predetermined position and obtaining an enlarged image corresponding to the designated position, a technique as described in JP-A-54-78075 has been known in which a desired position inside an observation view field is designated by a display pointer and a specimen is moved to the center of the observation view field.

This technique is effective when a position to be observed while being enlarged is within the observation view field. But when the position to be enlarged and observed is outside a view field range or outside a beam scanning permissible region, an enlarged image corresponding to that position cannot be obtained.

In general view field (or observation position) search, it is frequent that a position to be observed which is not only inside an observation view field but also outside a view field range is searched. Accordingly, approximate positioning is first carried out on an image at a magnification effective for view field (or observation position) search and thereafter, the magnification is gradually increased to determine an observation position and an observation magnification. However, the position search method as above lacks the function of marking an observation position and is difficult to achieve when observation is to be again effected at the same position.

SUMMARY OF THE INVENTION

An object of the present invention is to provide a scanning electron microscope suitable for facilitating search for an observation position which is outside a view field range.

To accomplish the above object, a scanning electron microscope according to the present invention comprises means for generating an information signal characteristic of a specimen by scanning the specimen with an electron beam, means for detecting the generated information signal, means for obtaining an observation image of the specimen on the basis of the detected information signal, means for storing the obtained observation image as an image which is used to designate observation position, means for reading the stored image for observation position designation, means for displaying the obtained observation image and the read-out image for observation position designation on individual display screen areas, means for designating an observation position on the displayed image for observation position designation, and means for controlling a position of the specimen scanned with the electron beam such that the designated observation position is moved to a predetermined position on the display screen area for the observation image and an observation image corresponding to the designated observation position is displayed on that display screen area.

DESCRIPTION OF THE PREFERRED EMBODIMENTS

Figure 1:
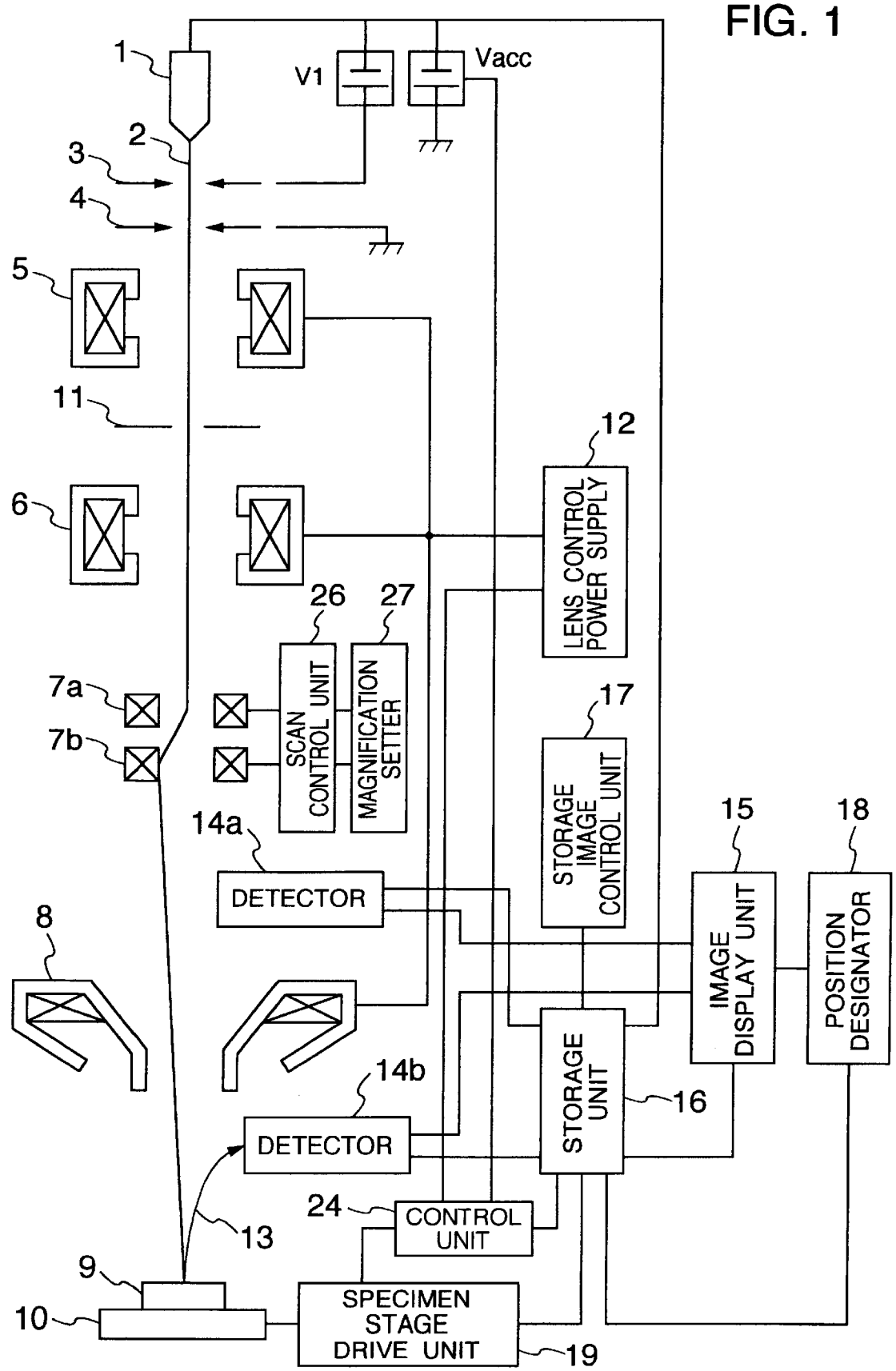
FIG. 1 is a diagram schematically showing the construction of a scanning electron microscope according to an embodiment of the present invention.

Referring now to FIG. 1 schematically showing the construction of a scanning electron microscope according to an embodiment of the present invention, an electron beam 2 emitted from a cathode 1 is drawn by draw voltage V1 applied across the cathode 1 and a draw electrode 3 and accelerated by accelerating voltage Vacc applied across the cathode 1 and an accelerating electrode 4. The electron beam 2 is focused on a specimen 9 carried on a specimen stage 10 by means of condensing lenses 5 and 6 and an objective lens 8 which are controlled by a lens control power supply 12. The specimen stage 10, accordingly, the specimen 9 can be moved in horizontal directions (X and Y directions) and in the axial direction of the electron beam 2 (Z direction) and can be rotated by means of a specimen stage drive unit 19. A scanning signal from a scan control unit 26 is applied to a two-stage deflector consisting of deflectors 7a and 7b, so that the specimen 9 is scanned two-dimensionally with the focused electron beam. Denoted by 11 is an aperture.

An information signal characteristic of the specimen 9, typically, a secondary electron signal 13 is generated from the specimen 9 under the irradiation of the electron beam 2. The generated secondary electron signal 13 is detected by a signal detector 14a and/or 14b. Either one or both of the detectors are used depending on the kind of the specimen and the height thereof. The signal detected by the detector 14a and/or 14b is guided, in the form of a brilliance modulation signal, to an image display unit 15 including a cathode ray tube (CRT). Although not illustrated in the figure, scanning in the CRT of the image display unit 15 is synchronous with the scanning of the specimen 9 with the electron beam 2 and consequently, an enlarged image (scanning image) of specimen 9 due to secondary electrons is displayed on real time base. The magnification of the enlarged image can be set desirably by means of the magnification setter 27.

Figure 2:
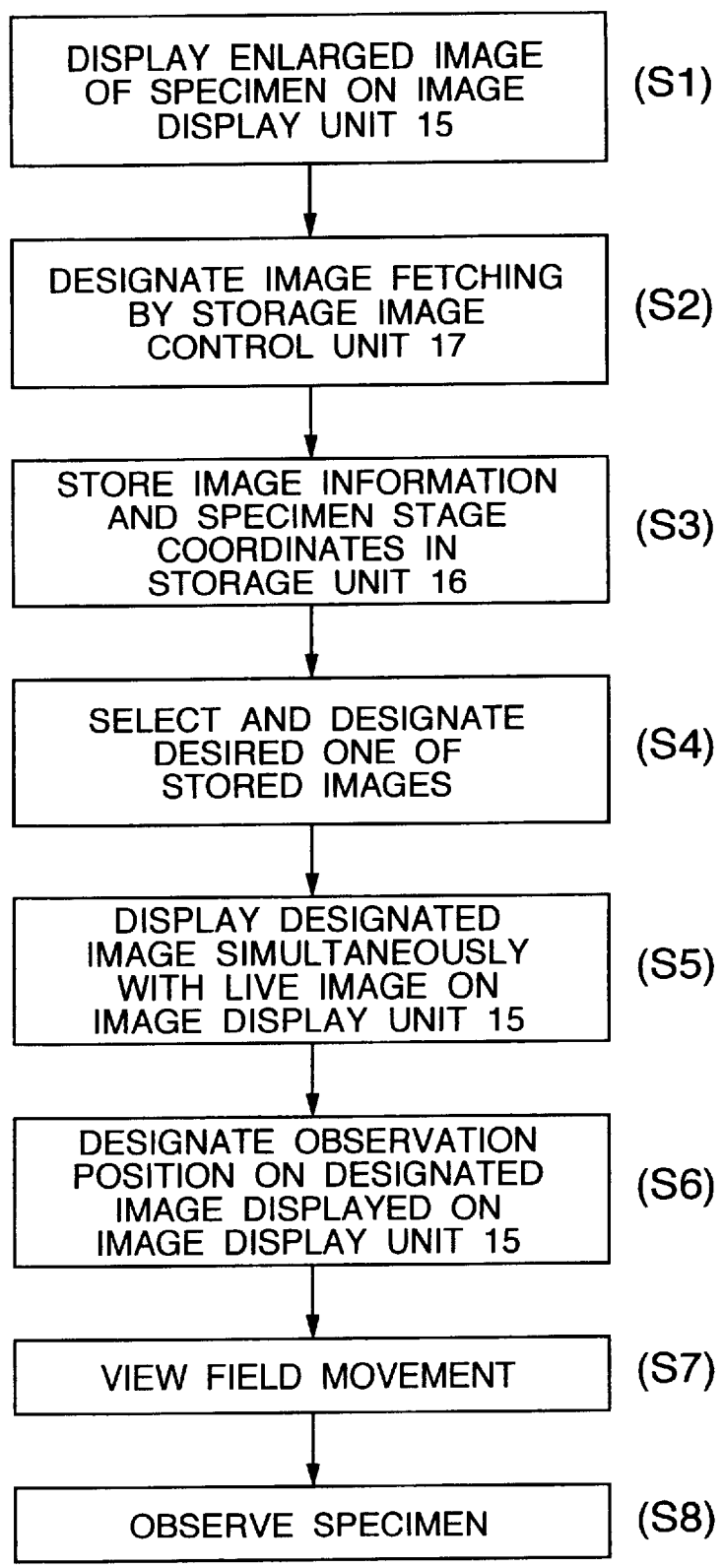
FIG. 2 is a flow chart showing, as an example, specimen observation.

Referring to FIG. 2 showing a flow of specimen observation, an enlarged image of the specimen 9 is first displayed on the image display unit 15 in the aforementioned manner (S1). When the enlarged image is designated by a storage image control unit 17 (S2), a signal indicative of the designated enlarged image is stored in a storage unit 16, together with a position on the specimen (a coordinate position on the specimen stage) corresponding to a position on the enlarged image (actually, a center position of the enlarged image) (S3). Of course, by executing the designation by plural times, a plurality of enlarged images at different positions on the specimen can be stored in the storage unit 16.

Figure 3:
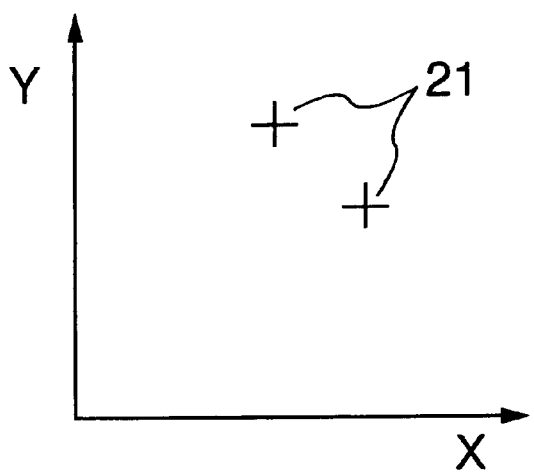
FIG. 3 is a graph showing, as an example, a map of coordinate positions on specimen stage of stored images.

A map of coordinate positions on specimen stage of stored images is illustrated in FIG. 3, and it may be displayed on the image display unit 15 in place of enlarged images of the specimen or alternatively, may be displayed separately. In the figure, positions on specimen 21 of the stored images are displayed in the form of position display pointers. When one of the position pointers is selected and designated by the storage image control unit 17, a stored image corresponding to the designated position is read (S4) and displayed, as an image which is used to designate observation position, on the image display unit 15 simultaneously with an enlarged image of the specimen obtained on real time base (S5).

Figure 4:
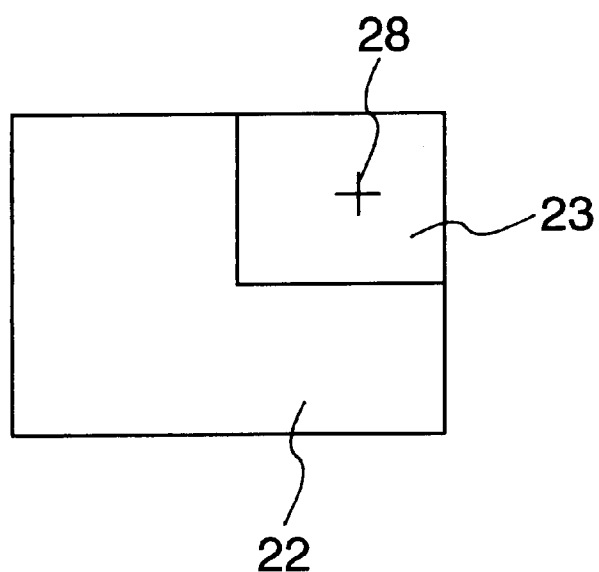
FIG. 4 is a diagram showing, as an example, an image display.

Referring to FIG. 4, an example of display is shown in which the enlarged image of the specimen obtained on real time base is displayed on a display screen area 22 of the image display unit 15 and at the same time the image read out by the designation and serving as an image which is used to designate observation position is displayed on a partial display screen area 23 of the area 22. In FIG. 4, a position display pointer 28 indicates a position of a part of the enlarged image desired to be observed while being enlarged. When the specimen stage 10 is rotated, the image for observation position designation is rotated correspondingly, and when the specimen stage 10 is rotated to move an observation position, the position display pointer 28 is moved correspondingly to the rotation direction and the movement. In FIG. 4, the image for observation position designation is displayed on the area 23 forming a part of the display screen area 22 but alternatively, may be displayed on a different area or side by side the enlarged image.

When a part of interest of the image displayed on the area 23, that is, the image for observation position designation is selected and designated by operating a position designator 28 (S6), a position signal of that designated part is read out of the storage unit 16 and supplied to the specimen stage drive unit 19. As a result, the specimen stage 10, accordingly, the specimen 9 is moved horizontally (to perform so-called view field or observation position movement) so that the position of the designated part may automatically be positioned at the center position of the display screen area 22 (S7), with the result that an enlarged image of the designated part (observation image) is displayed on the display screen area 22 to permit observation of the designated part (S8). The magnification of the enlarged image can be set freely by means of the magnification setter 27.

As will be seen from the foregoing, view field search can be accomplished by reading a stored image for observation position designation and hence the work of search for an observation position outside the view field range can be facilitated. Further, in addition to the image for observation position designation, a position thereof is also stored and therefore, position setting for re-observation can also be facilitated. Further, since the view field (observation position) search can be accomplished by reading a stored image, damage of the specimen due to the electron beam can be mitigated.

When the image for observation position designation is stored in the storage unit 16, an accelerating voltage, focusing conditions of the lenses, that is, exciting conditions and working distances (WD's) of the lenses 5, 6 and 8 at the time that the image is obtained may also be stored in the storage unit 16 in addition to the image for observation position designation and the position signal of the image. In this case, when the image for observation position designation is read, an accelerating voltage and focusing conditions and working distances of the lenses corresponding to the read-out image can be read and automatically set by means of a control unit 24. In an alternative, when the image for observation position designation is read, the exciting current of the objective lens may be controlled by the control unit 24 so as to bring the objective lens into in-focus.

Concurrently with the storage of the image for observation position designation in the storage unit 16, use conditions of the detectors 14a and 14b may also be stored. In this case, when the image for observation position designation is read, use conditions of the detectors 14a and 14b corresponding to the read-out image may also be read and set automatically by means of the control unit 24.

One or more positions on the image for observation position designation displayed on the display screen area 23 and images at higher magnification than that of the displayed image for observation position designation and corresponding to those positions may be stored in the storage unit 16. In this case, the stored positions on the displayed image for observation position designation are displayed in the form of position display pointers on the displayed image, and stored higher-magnification images at those positions may be read by designating the displayed positions so as to be displayed on the display screen area 22.

An image for observation position designation to be stored in the storage unit 16 may be an image of a linkage of images obtained by scanning divisional areas of the specimen with the electron beam. This is effective for observation of an area which is wider than the scanning permissible range.

According to the present invention, the scanning electron microscope suitable for facilitating view field or observation point search outside the view field range can be provided.

What is claimed is:

1. A scanning electron microscope comprising:

a cathode;

a condensing lens for focusing an electron beam emitted from said cathode;

a scanning deflector for scanning a specimen with said electron beam;

a detector for detecting electrons emitted from said specimen by the electron beam scanning;

a storage unit for storing coordinate information indicative of a plurality of points on said specimen and enlarged images of said specimen corresponding to said coordinate information;

a display unit, having a screen, for displaying a specimen region including said coordinate information indicative of said plurality of points stored in said storage unit as a coordinate map and displaying pointers on said coordinate map on the basis of said coordinate information indicative of said plurality of points; and a control unit for designating one of said pointers on said screen of said display unit;

wherein one of said enlarged images is read from said storage unit in accordance with the designation by said control unit and displayed on the screen of said display unit at a magnification larger than that of said coordinate map.

2. A scanning electron microscope according to claim 1, wherein said storage unit stores a plurality of enlarged images on said specimen.

3. A scanning electron microscope according to claim 1, further comprising means for designating a point of said coordinate information and means for reading out said enlarged image corresponding to the designated point, wherein said display unit displays the read enlarged image.

4. A scanning electron microscope according to claim 3, wherein said storage unit stores an optical condition for obtaining the enlarged images and said display unit displays the stored enlarged image and an image obtained on real time base on the basis of said optical conditions.

5. A scanning electron microscope comprising:

a cathode;

a condensing lens for focusing an electron beam emitted from said cathode;

a scanning deflector for scanning a specimen with said electron beam;

a detector for detecting electrons emitted from said specimen by the electron beam scanning;

a specimen stage for supporting said specimen;

a storage unit for storing coordinate information indicative of a plurality of points on said specimen and enlarged images of said specimen corresponding to said coordinate information;

a display unit, having a screen, a specimen region including said coordinate information indicative of said plurality of points stored in said storage unit as a coordinate map and displaying pointers on said coordinate map on the basis of said coordinate information indicative of said plurality of points; and a control unit for designating one of said pointers on said screen of said display unit;

wherein said specimen stage is moved and said scanning deflector sets a deflection range in accordance with said designation by said control unit, thereby causing an enlarged image of the specimen at the designated point to be displayed on said screen.

6. A scanning electron microscope comprising:

a cathode;

a condensing lens for focusing an electron beam emitted from said cathode;

a scanning deflector for scanning a specimen with said electron beam;

a detector for detecting electrons emitted from said specimen by the electron beam scanning;

a specimen stage for supporting said specimen;

a storage unit for storing at least one of coordinate information indicative of a plurality of points on said specimen, an accelerating voltage for said electron beam, an exciting condition of said condensing lens and a working distance of said specimen; and a control unit for designating a coordinate on said specimen;

a display unit having a screen, specimen region including said coordinate information indicative of said plurality of points stored in said storage unit as a coordinate map and displaying pointers on said coordinate map on the basis of said coordinate information indicative of said plurality of points; and a control unit for designating one of said pointers on said screen of said display unit;

wherein at least one of drives of the accelerating voltage for said electron beam, the exciting condition of said condensing lens and said specimen stage, in direction of the electron beam irradiated position, is executed on the basis of the designation of the pointer by said control unit, thereby causing an enlarged image of the specimen at the designated point to be displayed on said screen.

7. A scanning electron microscope according to claim 6, further comprising a display unit for displaying an image of said specimen and the coordinate on said specimen, wherein said storage unit stores at least one of accelerating voltages for said electron beams, exciting conditions of said condensing lens and working distances of said specimen, for every coordinate designated by said display unit and said control unit.

* * * * *